United States Patent

[11] 3,597,703

[72] Inventor Robert A. Lebowitz
Brooklyn, N.Y.
[21] Appl. No. 779,774
[22] Filed Nov. 29, 1968
[45] Patented Aug. 3, 1971
[73] Assignee PRD Electronics, Inc.
Westbury, N.Y.

[54] IMPATT DIODE OSCILLATORS
1 Claim, 5 Drawing Figs.

[52] U.S. Cl. .......... 331/107 R, 331/96
[51] Int. Cl. .......... H03b 7/06
[50] Field of Search .......... 331/107, 96, 117; 307/307

[56] References Cited
UNITED STATES PATENTS

| | | | |
|---|---|---|---|
| 3,141,141 | 7/1964 | Sharpless | 331/107 |
| 3,160,826 | 12/1964 | Marcatili | 331/107 |
| 3,254,309 | 5/1966 | Miller | 331/107 |
| 3,474,351 | 10/1969 | Cook et al. | 331/107 |

*Primary Examiner*—John Kominski
*Attorney*—Hill, Sherman, Meroni and Gross

ABSTRACT: A microwave frequency oscillator using an impatt diode in conjunction with a waveguide cavity to provide wideband tunability at high frequencies. An impatt or similar type solid-state device is embedded within a slit which is formed in an end wall of a circular or rectangular waveguide. The waveguide cavity has an effective length which is a multiple of one-half of the wavelength at the center frequency. A quarter wavelength cavity is then coupled to the wall of the half wavelength cavity having the impatt diode. In this way wideband tunability is achieved and an output signal is developed which has a substantially reduced noise content.

INVENTOR.
ROBERT A. LEBOWITZ

BY Hill, Sherman, Meroni, Gross & Simpson ATTORNEYS

IMPATT DIODE OSCILLATORS

BACKGROUND OF THE INVENTION

1. Description of the Prior Art

Recent discoveries in semiconductor devices have led to the development of diodes which can be effectively used as sources of microwave energy. The development of impact avalanche and transit-time diodes and related semiconductor devices has encountered much enthusiasm in the microwave industry. Research and development companies are presently at work in developing means and techniques for effectively utilizing the advantages of solid-state diodes as high frequency oscillators. The technical journals and magazines are replete with articles concerning new developments in the field of solid-state microwave products. One of the major objectives, however, of research and development work in this area is to provide wide band tunability of oscillators using impatt or related diodes. The present invention provides such wide band tunability. A detailed description of semiconductor type devices described above can be found in an article in the IEEE Spectrum of Jan. 1968, in an article entitled Negative Conductance In SemiConductors by Herbert Kroemer, pages 47 through 56. This article contains an excellent bibliography of some 46 items which serve as a prior art background for the present invention, and reviews in detail the development and use of solid-state devices in the microwave area.

2. Field of the Invention

The field of art to which this invention pertains is high frequency oscillators and particularly to oscillators in the microwave frequency area which utilize solid-state devices and in particular which employ impatt diodes in the oscillating circuit.

SUMMARY OF THE INVENTION

It is an important feature of the present invention to provide an improved microwave frequency oscillator.

It is another feature of the present invention to utilize solid state semiconductor devices in a microwave oscillator.

It is an object of the present invention to provide a microwave frequency oscillator having wide band tunability.

It is another object of the present invention to provide an impatt diode oscillator and waveguide combination arrangement which utilizes an impatt diode for sustaining oscillations over a wide frequency range.

It is also an object of this invention to provide a microwave frequency oscillator wherein an impatt diode is embedded in one of the walls of a waveguide cavity.

It is an additional object of the present invention to provide a microwave frequency oscillator including first and second cavities wherein the first cavity is a multiple length of one-half the wave length of the central frequency and wherein the second cavity has a length equal to one-quarter of the wave length and wherein an impatt diode is embedded in a wall disposed intermediate the first and second cavities.

It is another object of the present invention to provide an impatt diode oscillator having an impatt diode embedded in a wall of a microwave cavity to provide improved purity of signal over a wider frequency range.

These and other objects, features and advantages of the present invention will be understood in greater detail from the following description and the associated drawing wherein reference numerals are utilized to designate an illustrative embodiment.

DESCRIPTION OF THE PREFERRED EMBODIMENT

The term impatt diode is used throughout the present application and refers generally to a semiconductor device which sustains high frequency oscillations when a direct voltage is applied thereto. However, the term impatt diode is intended to be used in the generic sense to cover any such type semiconductor device which has been found or may be found to function similarly and which when used in the same apparatus as described herein produces similar comparably desirable frequency responses.

The term impatt diode refers to impatt avalanche transit-time diodes which have been found to operate in the reverse bias or breakdown region in such a way as to sustain high frequency oscillations in the microwave range. However, operation in the breakdown region tends to generate considerable noise and accordingly it is a desirable feature of every oscillator utilizing such semiconductor devices to reduce the noise content of the signal.

Also, impatt diodes and related devices are generally responsive to an input signal for sustaining oscillations within a discreet frequency range. The given frequency range for a given diode is generally a function of its physical characteristics such as doping, size of the various layers forming the diode, geometric configuration and the like. However, it is desirable to provide a diode oscillator which can operate over a wide frequency range simply by adjusting a knob or dial on the oscillator. Accordingly, tunability of an oscillator is an important feature when solid-state semiconductor devices as are presently known are utilized.

The present invention teaches the use of a simplified apparatus which achieves remarkable frequency stability and wide band tuning as well as low noise content for the output signal. The apparatus consists of a combination of waveguide components and an impatt diode oscillator circuit which when taken together provide a resonant circuit at the desired frequency of operation.

In general, the apparatus involved consists of two waveguide portions, one of which has a length which is a multiple of one-half the wavelength at the center frequency and the other which is a quarter wavelength long. The half wavelength or multiple half wavelength unit is the tunable cavity, while the quarter wavelength unit is merely a backup cavity for the diode oscillator. The diode itself is disposed in a wall intermediate the two cavities and is mounted in an elongated slit formed in the wall. It has been found that by tuning the half wavelength or multiple half wavelength cavity, wide band frequency response can be achieved for a given diode oscillator. It also has been found that the signal as best achieved has a low noise content. The result is an inexpensive and effective way for providing wide band tunability for present day impatt diode oscillators.

Figure 1:
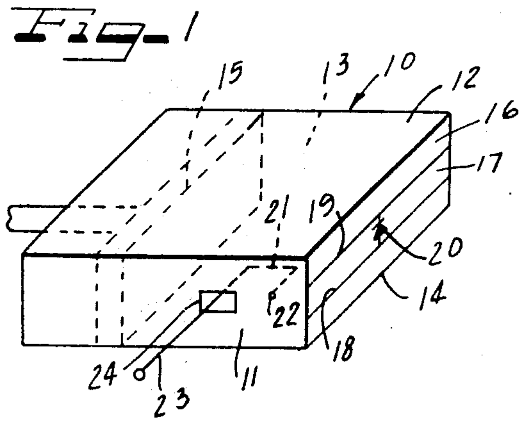
FIG. 1 is a schematic view of a waveguide cavity according to the present invention showing a slit formed in an end wall of the cavity an an impatt diode disposed in the slit and wherein means are provided to tune the cavity to a desired central frequency.

Referring specifically to the drawing, FIG. 1 shows a rectangular waveguide 10 having wall portions 11, 12, 13 and 14 defining an inner cavity. The cavity has the required geometrical configuration to allow proper tuning at the desired central frequency. Specific tuning of the cavity may be accomplished by adjusting a tuning short 15.

An end wall 16 is formed at one end of the cavity and is provided with a slit 17 defined by opposing edges 18 and 19. The slit 17 is shown to have a length which is substantial in comparison to the width thereof, and an impatt diode 20 or similar related semiconductor device is bridged across the opposing edges 18 and 19 of the slit 17. The diode 20 is coupled in a DC circuit and is energized to sustain oscillations at a desired frequency. The output signal may be coupled from the cavity by means of a loop 21 which is connected to the wall 11 at point 22 and which has a portion 23 which extends through an opening 24 formed in the sidewall 11. The output signal may also be coupled from the cavity by means of a suitable iris and further waveguide portion as is well understood.

Figure 2:
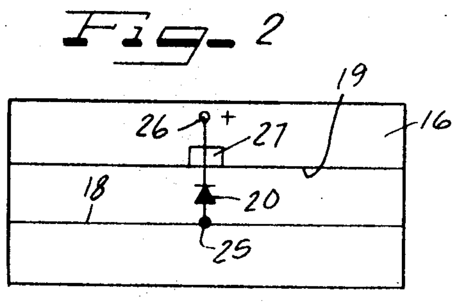
FIG. 2 is an enlarged view of the end wall shown in FIG. 1 which contains the impatt diode and showing in particular the coupling of the diode to opposing edges of the slit.

An enlarged view of the end wall 16 is shown in FIG. 2. In particular, the diode 20 is shown as coupled to the edge 18 of the wall 16 at a point 25 and is connected to a positive voltage supply at a point 26. An insulator member 27 is disposed adjacent to the edge 19 of the wall 16 and makes a capacitive coupling to the wall 16.

Figure 3:
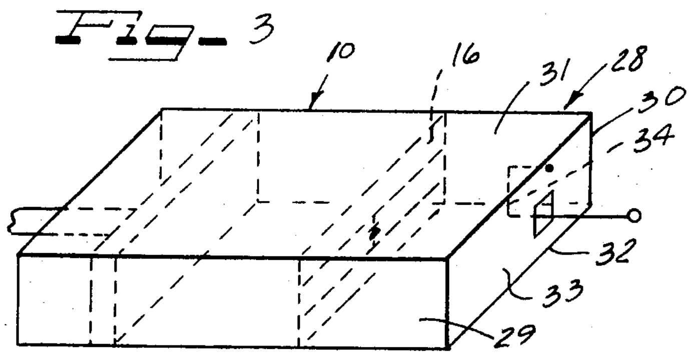
FIG. 3 shows the combination of a half wavelength cavity and a quarter wavelength cavity wherein the quarter wavelength cavity backs up the half wavelength cavity at the end face thereof which contains the slit shown in FIG. 2 and the associated impatt diode arrangement.

FIG. 3 shows the combination of the waveguide portion 10 and a further waveguide portion 28 which is provided as a backup portion to the wall 16 containing the impatt diode as shown in FIG. 2. The waveguide portion 28 has sidewalls 29, 30, 31 and 32. The open end of the cavity is mounted directly against the wall 16 of the waveguide portion 10. The waveguide portion 28 is also provided with an end wall 33 which is spaced approximately one-quarter of a wavelength from the end wall 16 of the waveguide portion 10. An output loop 34 similar to the loop 21 of FIG. 1 may be coupled to the end wall 33 of the quarter wavelength portion 28. In the alternative, of course, the loop may be coupled as shown in FIG. 1 to a sidewall of the waveguide portion 10.

The arrangement shown in FIG. 3 has been found to provide wide band frequency response and greatly improved noise reduction in the output signal.

Figure 4:
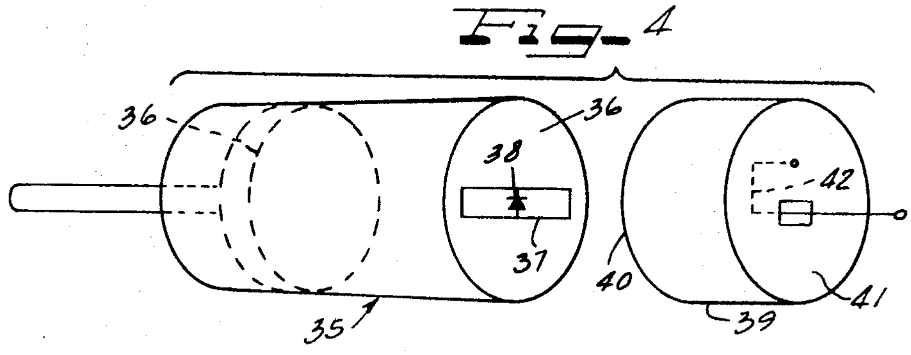
FIG. 4 is an alternate form of the present invention showing the use of a slit and an impatt diode which is disposed in the end wall of a circular waveguide and wherein means are provided for tuning the cavity to a central desired frequency. Also shown in FIG. 4 is a backup quarter wavelength cavity which may be coupled directly to the end face of the half wavelength cavity which contains the impatt diode.

An alternate embodiment of the present invention is shown in FIG. 4 where a cylindrical waveguide 35 is provided in place of the rectangular waveguide 10 as shown in FIG. 1. The cylindrical waveguide portion 35 has an effective length which is a multiple of one-half the wavelength of the central frequency. The effective length of the waveguide portion 35 may be adjusted by moving a short 36 in a well understood manner. The waveguide portion 35 has an end wall 36 in which is formed a rectangular slit 37 as shown. An impatt diode or related semiconductor device is disposed in the slit 37 and is mounted generally in a comparable manner to that shown in FIG. 2. In this case, the backup waveguide portion is also a cylindrical waveguide 39 which is approximately a quarter of a wavelength from an opened end 40 to a closed end thereof 41. As in the case of the rectangular waveguide of FIGS. 1 and 3, an output loop 42 may be coupled from the end wall 41 in a well understood manner. The quarter wavelength cavity 39 is shown displaced from the end wall 36 of the cavity 35, however, these units are normally mounted together to form a single resonant circuit.

Figure 5:
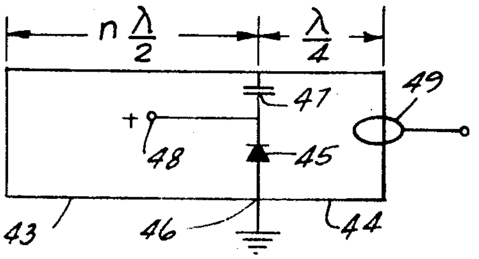
FIG. 5 is a diagrammatic view of the relationship of the two cavities of the present invention as they relate to the positioning of an impatt diode to provide optimum signal response characteristics when tuned to the desired central frequency.

In FIG. 5 a simplified schematic showing of the waveguide and impatt diode arrangement described in FIGS. 1 through 4 is illustrated. The length of the first cavity portion 43 is shown to be $n\mu/2$. The length of the second waveguide portion 44 is shown to be $n\mu/2$. The impatt diode is identified by numeral 45 and is coupled from ground at point 46 to and through a capacitor 47. Also, an output loop 49 is shown schematically to represent the coupling of energy from the resonant network to points exterior thereof.

By means of the embodiments described above, wide band tunability for an impatt diode oscillator has been achieved with relatively low cost and with relatively high noise reduction.

I claim as my Invention

1. A microwave frequency oscillator comprising:

a microwave conductor cavity being an integral number of half wavelengths within the frequency of operation unit and having an end wall, said end wall having a cut away portion, an impatt diode disposed in said cut away portion of said end wall, and a quarter wavelength microwave conductor cavity within the frequency of operation unit coupled to said end wall having the cut away portion and terminating in a second end wall spaced from said first mentioned end wall by approximately one-quarter wavelength at the desired center frequency.